United States Patent
Liebmann et al.

(10) Patent No.: US 12,224,281 B2
(45) Date of Patent: Feb. 11, 2025

(54) INTERDIGITATED DEVICE STACK

(71) Applicant: TOKYO ELECTRON LIMITED, Tokyo (JP)

(72) Inventors: Lars Liebmann, Mechanicsville, NY (US); Jeffrey Smith, Clifton Park, NY (US); Daniel Chanemougame, Niskayuna, NY (US); Paul Gutwin, Williston, VT (US); Brian Cline, Austin, TX (US); Xiaoqing Xu, Austin, TX (US); David Pietromonaco, San Jose, CA (US)

(73) Assignee: TOKYO ELECTRON LIMITED, Tokyo (JP)

( * ) Notice: Subject to any disclaimer, the term of this patent is extended or adjusted under 35 U.S.C. 154(b) by 588 days.

(21) Appl. No.: 17/541,609

(22) Filed: Dec. 3, 2021

(65) Prior Publication Data

US 2022/0181318 A1    Jun. 9, 2022

Related U.S. Application Data

(60) Provisional application No. 63/121,846, filed on Dec. 4, 2020.

(51) Int. Cl.
*H01L 27/06* (2006.01)
*H01L 27/092* (2006.01)

(52) U.S. Cl.
CPC ........ *H01L 27/0688* (2013.01); *H01L 27/092* (2013.01)

(58) Field of Classification Search
CPC ............... H01L 27/0688; H01L 27/092; H01L 29/78696; H01L 21/823828;
(Continued)

(56) References Cited

U.S. PATENT DOCUMENTS

| 9,564,493 B2 | 2/2017 | Colinge et al. |
| 9,721,957 B2 | 8/2017 | Nakanishi et al. |

(Continued)

FOREIGN PATENT DOCUMENTS

| KR | 10-2015-0073262 A | 7/2015 |
| WO | WO 2019/112953 A1 | 6/2019 |
| WO | WO 2020/055642 A2 | 3/2020 |

OTHER PUBLICATIONS

International Search Report and Written Opinion issued Mar. 28, 2022, in PCT/US2021/062049, 10 pages.

*Primary Examiner* — Vu A Vu
(74) *Attorney, Agent, or Firm* — Oblon, McClelland, Maier & Neustadt, L.L.P.

(57) ABSTRACT

A semiconductor device includes a first pair of transistors over a substrate. The first pair of transistors includes a first transistor having a first gate structure over the substrate and a second transistor having a second gate structure stacked over the first transistor. A second pair of transistors is stacked over the first pair of transistors, resulting in a vertical stack perpendicular to a working surface of the substrate. The second pair of transistors includes a third transistor having a third gate structure stacked over the second transistor and a fourth transistor having a fourth gate structure stacked over the third transistor. The third gate structure extends from a central region of the vertical stack to a first side of the vertical stack. The second gate structure and the fourth gate structure extend from the central region to a second side of the vertical stack opposite the first side.

20 Claims, 5 Drawing Sheets

(58) Field of Classification Search
CPC ............... H01L 29/0673; H01L 29/775; H01L 21/8221; H01L 21/823878; H01L 29/42392; H01L 27/0924; B82Y 10/00
USPC ........................................................ 257/399
See application file for complete search history.

(56) References Cited

U.S. PATENT DOCUMENTS

| | | | |
|---|---|---|---|
| 9,929,257 B2 | 3/2018 | Colinge et al. | |
| 9,997,523 B2 | 6/2018 | Nakanishi et al. | |
| 10,312,229 B2* | 6/2019 | Moroz | H01L 29/4238 |
| 10,461,179 B2 | 10/2019 | Colinge et al. | |
| 10,672,742 B2* | 6/2020 | Wu | H01L 29/66 |
| 10,811,415 B2* | 10/2020 | Sengupta | H01L 21/8221 |
| 10,818,780 B2 | 10/2020 | Colinge et al. | |
| 10,833,078 B2 | 11/2020 | Smith et al. | |
| 11,114,381 B2 | 9/2021 | Liebmann et al. | |
| 11,133,221 B2* | 9/2021 | Ng | H01L 29/41791 |
| 11,217,629 B2* | 1/2022 | Lin | H10N 70/021 |
| 11,362,001 B2* | 6/2022 | Liu | H01L 21/823412 |
| 11,393,924 B2* | 7/2022 | Liang | H01L 29/401 |
| 11,594,610 B2* | 2/2023 | Chiu | H01L 29/66545 |
| 11,621,195 B2* | 4/2023 | Pan | H01L 29/42392 |
| | | | 438/149 |
| 2015/0179655 A1 | 6/2015 | Nakanishi et al. | |
| 2016/0268382 A1 | 9/2016 | Colinge et al. | |
| 2017/0125554 A1 | 5/2017 | Colinge et al. | |
| 2017/0294441 A1 | 10/2017 | Nakanishi et al. | |
| 2018/0190799 A1 | 7/2018 | Colinge et al. | |
| 2019/0172828 A1 | 6/2019 | Smith et al. | |
| 2020/0006535 A1 | 1/2020 | Colinge et al. | |
| 2020/0020812 A1 | 1/2020 | Masuoka et al. | |
| 2020/0075489 A1 | 3/2020 | Liebmann et al. | |
| 2021/0028169 A1 | 1/2021 | Smith et al. | |
| 2021/0043756 A1 | 2/2021 | Colinge et al. | |
| 2021/0351132 A1 | 11/2021 | Liebmann et al. | |

* cited by examiner

INTERDIGITATED DEVICE STACK

INCORPORATION BY REFERENCE

This present disclosure claims the benefit of U.S. Provisional Application No. 63/121,846 filed on Dec. 4, 2020, which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device.

Aspect (1) includes a semiconductor device. The semiconductor device includes a first pair of transistors positioned over a substrate. The first pair of transistors includes a first transistor having a first gate structure positioned over the substrate and a second transistor having a second gate structure stacked over the first transistor. A second pair of transistors is stacked over the first pair of transistors, resulting in a vertical stack perpendicular to a working surface of the substrate. The second pair of transistors includes a third transistor having a third gate structure stacked over the second transistor and a fourth transistor having a fourth gate structure stacked over the third transistor. The third gate structure extends from a central region of the vertical stack to a first side of the vertical stack. The second gate structure and the fourth gate structure both extend from the central region to a second side of the vertical stack opposite the first side.

Aspect (2) includes the semiconductor device of aspect (1), further including a first inter-level contact positioned on the first side of the vertical stack and configured to electrically connect the first gate structure to the third gate structure. A second inter-level contact is positioned on the second side of the vertical stack and configured to electrically connect the second gate structure to the fourth gate structure.

Aspect (3) includes the semiconductor device of aspect (2), wherein the first inter-level contact is positioned between the first gate structure and the third gate structure. The first inter-level contact bypasses the second gate structure from the first side of the vertical stack.

Aspect (4) includes the semiconductor device of aspect (2), wherein the second inter-level contact is positioned between the second gate structure and the fourth gate structure. The second inter-level contact bypasses the third gate structure from the second side of the vertical stack.

Aspect (5) includes the semiconductor device of aspect (1), further including a first channel structure surrounded by the first gate structure, a second channel structure surrounded by the second gate structure, a third channel structure surrounded by the third gate structure and a fourth channel structure surrounded by the fourth gate structure.

Aspect (6) includes the semiconductor device of aspect (5), wherein the first channel structure, the second channel structure, the third channel structure and the fourth channel structure extend in a horizontal direction parallel to the working surface of the substrate.

Aspect (7) includes the semiconductor device of aspect (6), wherein the first channel structure, the second channel structure, the third channel structure and the fourth channel structure each include one or more respective nanosheets that extend in the horizontal direction and are spaced apart from one another.

Aspect (8) includes the semiconductor device of aspect (5), wherein the first channel structure, the second channel structure, the third channel structure and the fourth channel structure are positioned in the central region.

Aspect (9) includes the semiconductor device of aspect (1), further including a first contact structure positioned on the first side of the vertical stack and configured to electrically connect the third gate structure to a first wiring structure.

Aspect (10) includes the semiconductor device of aspect (9), further including a second contact structure positioned over the fourth gate structure and configured to electrically connect the fourth gate structure to a second wiring structure.

Aspect (11) includes the semiconductor device of aspect (10), further including power rails positioned along the first side and the second side of the vertical stack and configured to be electrically connected to the first wiring structure and the second wiring structure.

Aspect (12) includes the semiconductor device of aspect (9), wherein the first contact structure is positioned over the third gate structure and bypasses the fourth gate structure from the first side of the vertical stack.

Aspect (13) includes the semiconductor device of aspect (1), wherein the first gate structure, the second gate structure, the third gate structure and the fourth gate structure are spaced apart from one another.

Aspect (14) includes the semiconductor device of aspect (1), wherein the first gate structure extends from the central region to the first side, or the first gate structure extends from the central region to the first side and the second side.

Aspect (15) includes the semiconductor device of aspect (1), wherein the first pair of transistors includes a first complementary field-effect transistor (CFET). The second pair of transistors includes a second CFET.

Aspect (16) includes the semiconductor device of aspect (15), wherein the first transistor is a p-type field-effect transistor (FET). The second transistor is an n-type FET. The third transistor is an n-type FET. The fourth transistor is a p-type FET.

Aspect (17) includes a semiconductor device. The semiconductor device includes pairs of transistors stacked over a substrate, resulting in a vertical stack perpendicular to a working surface of the substrate. Each pair of transistors including a respective top transistor having a respective top gate stacked over a respective bottom transistor having a respective bottom gate. A plurality of bottom gate structures extends from a central region of the vertical stack to a first side of the vertical stack. A plurality of top gate structures extends from the central region to a second side of the vertical stack opposite the first side.

Aspect (18) includes the semiconductor device of aspect (17), further including first inter-level contacts positioned on the first side of the vertical stack and each configured to electrically connect two respective bottom gate structures. Second inter-level contacts are positioned on the second side of the vertical stack and each configured to electrically connect two respective top gate structures.

Aspect (19) includes the semiconductor device of aspect (18), wherein at least one first inter-level contact bypasses a respective top gate structure from the first side of the vertical stack. At least one second inter-level contact bypasses a respective bottom gate structure from the second side of the vertical stack.

Aspect (20) includes the semiconductor device of aspect (19), further including a first contact structure positioned on the first side of the vertical stack and positioned over a respective bottom gate structure of a topmost pair of transistors and bypasses a respective top gate structure of the topmost pair of transistors from the first side of the vertical stack. A second contact structure is positioned over the respective top gate structure of the topmost pair of transistors.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein include a novel construct and the associated process integration solution that enables efficient and compact integration of transistors into dense 3D logic functions. 3D integration (3Di), i.e. the vertical stacking of multiple devices, aims to overcome scaling limitations experienced in conventional two-dimensional very large-scale integration (VLSI) by increasing the transistor density in volume rather than area. The particular 3Di solution here is particularly applicable to transistor-on-transistor (ToT) 3Di. In ToT 3Di, multiple field-effect transistors (FET) are stacked vertically on top of each other. For example, the most basic form of ToT 3Di is the complementary FET (CFET) in which complementary pairs of n-type and p-type transistors are stacked either monolithically or sequentially. The ToT 3Di approach herein expands this concept and stacks two sets of CFET on top of each other.

Figure 1A:
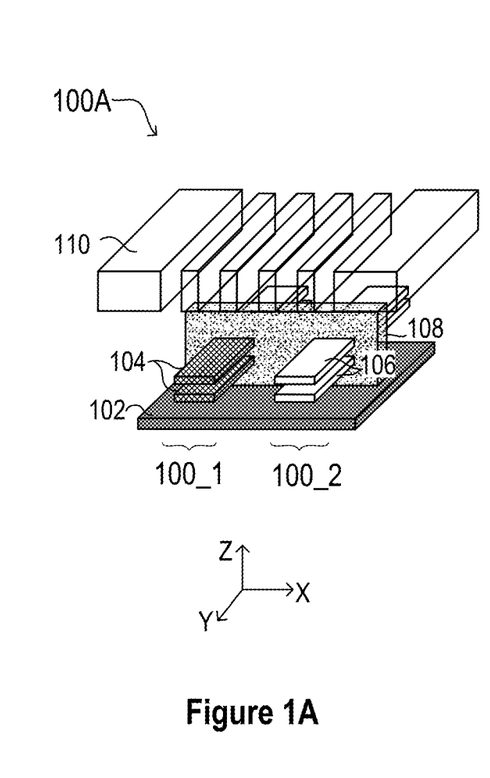
FIG. 1A shows a schematic view of an n-type transistor and a p-type transistor arranged side by side.

FIG. 1A shows a schematic view of a semiconductor device 100A including an n-type field-effect transistor 100_1 and a p-type field-effect transistor 100_2 arranged side by side. As illustrated, the n-type field-effect transistor 100_1 and the p-type field-effect transistor 100_2 are positioned over a substrate 102. The n-type field-effect transistor 100_1 can include a channel structure 104 that includes one or more nanosheets extending along a horizontal direction (e.g.

the Y direction). The p-type field-effect transistor 100_2 can include a channel structure 106 that includes one or more nanosheets extending along the horizontal direction (e.g. the Y direction). A common gate structure 108 can be formed to surround the channel structures 104 and 106. In addition, power rails 110 can be formed over the common gate structure 108 and configured to provide operation voltages to the n-type field-effect transistor 100_1 and the p-type field-effect transistor 100_2.

Figure 1B:
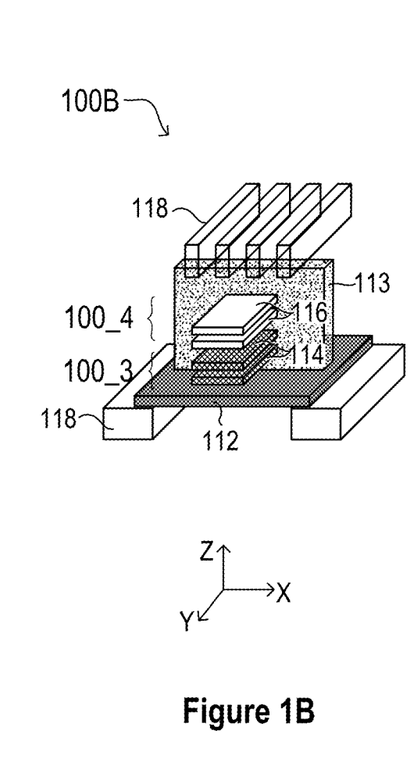
FIG. 1B shows a schematic view of a complementary FET (CFET) device.

FIG. 1B shows a schematic view of a semiconductor device 100B including a CFET device disposed over a substrate 112. The CFET device can include a p-type field-effect transistor 100_4 and an n-type field-effect transistor 100_3 that are stacked over the substrate 112. The p-type field-effect transistor 100_4 can have a channel structure 116 positioned over a channel structure 114 of the n-type field-effect transistor 100_3. A common gate structure 113 can be positioned over the substrate 112 and around the channel structures 114 and 116. Power rails 118 can be positioned over the common gate structure 113 and/or disposed in the substrate 112 so as to be coupled to the p-type field-effect transistor 100_4 and the n-type field-effect transistor 100_3.

Figure 1C:
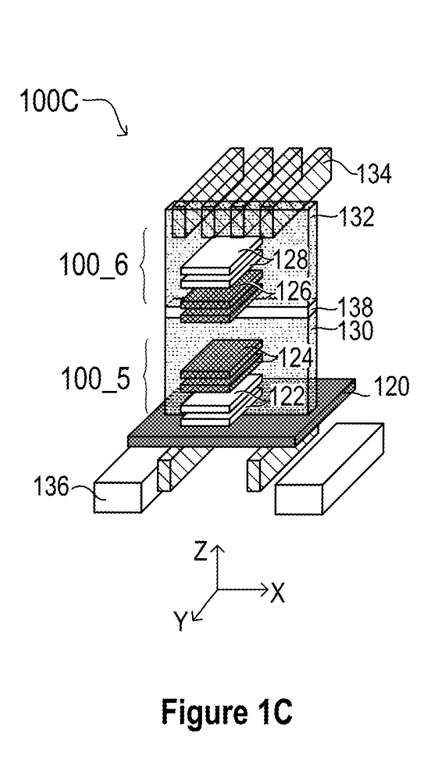
FIG. 1C shows a schematic view of a first CFET device stacked over a second CFET device, in accordance with some embodiments of the present disclosure.

FIG. 1C shows a schematic view of a semiconductor device 100C including vertically stacked CFET devices 100_5 and 100_6, in accordance with some embodiments. The CFET devices 100_5 and 100_6 can be stacked over a substrate 120. Each of the CFET devices 100_5 and 100_6 can include a respective n-type field-effect transistor and a respective p-type field-effect transistor that are stacked over each other. For example, the CFET device 100_5 can include a first n-type field-effect transistor stacked over a first p-type field-effect transistor. The first n-type field-effect transistor can include a channel structure 124 positioned over a channel structure 122 of the first p-type field-effect transistor. A first common gate structure 130 can be formed to surround the channel structures 122 and 124. The CFET device 100_6 can include a second p-type field-effect transistor stacked over a second n-type field-effect transistor. The second p-type field-effect transistor can include a channel structure 128 positioned over a channel structure 126 of the second n-type field-effect transistor. A second common gate structure 132 can be formed to surround the channel structures 126 and 128. Further, interconnect contacts 134 can be formed over the second common gate structure 132. An insulating structure 138 can be disposed between the CFET device 100_5 and the CFET device 100_6. (Buried) power rails 136 can be positioned within the substrate 120.

Figure 2A:
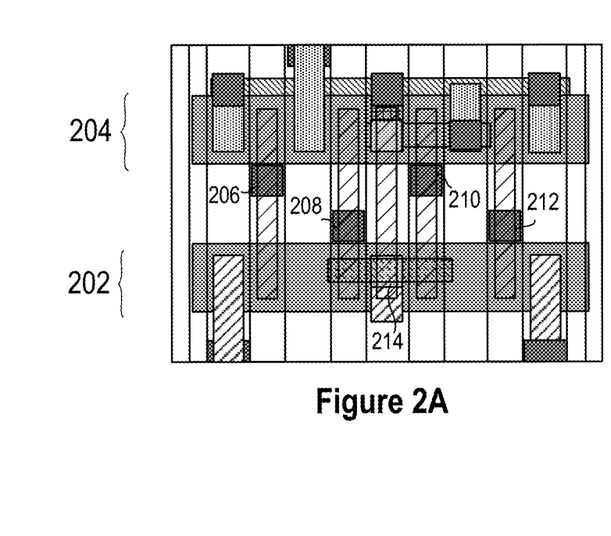
FIG. 2A shows a layout design including n-type transistors and p-type transistors arranged side by side.
Figure 2B:
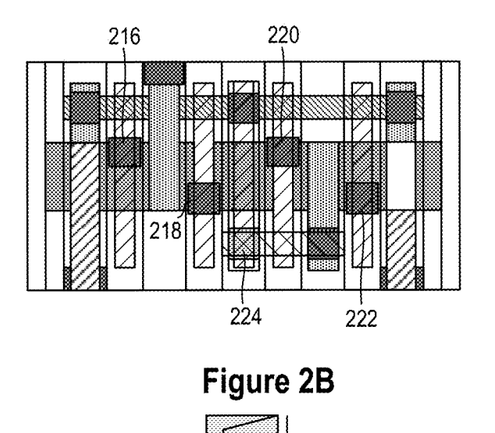
FIG. 2B shows a layout design including CFET devices.

As illustrated in FIGS. 2A and 2B, CFET can improve transistor density in standard cell logic designs by reducing the height of the standard cell, effectively by folding the "p half" of the standard cell over (on top of) the "n half." Note that when considering a cell layout from a top view, the term "height" refers to a lateral dimension of the cell layout.

FIG. 2A shows a layout of a standard cell logic design, where a plurality of p-type transistors 202 can be positioned side by side with a plurality of n-type transistors 204. A plurality of contacts (e.g. 206, 208, 210, 212 and 214) can be connected to input and output signals. For example, the contacts 206, 208, 210, and 212 can be connected to input signals, and the contact 214 can be connected to an output signal.

In FIG. 2B, the "p half" (e.g. the plurality of p-type transistors 202) can be folded over the "n half" (e.g. the plurality of n-type transistors 204). That is, the plurality of p-type transistors 202 can be disposed over, instead of being arranged side by side with, the plurality of n-type transistors 204. As a result, a plurality of CFET devices can be formed.

Similarly, contacts 216, 218, 220, and 222 can be connected to input signals, and a contact 224 can be connected to an output signal.

Figure 2C:
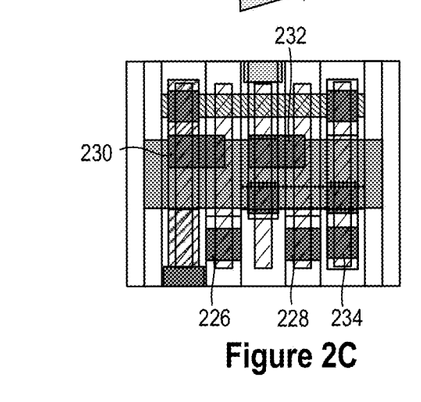
FIG. 2C shows a layout design including vertically stacked CFET devices, in accordance with some embodiments.

As shown in FIG. 2C, stacked CFET can further improve the transistor density by reducing the width of the standard cell by effectively folding the cell in FIG. 2B left-over-right. That is, a first group of CFET devices can be disposed or stacked over, instead of being arranged side by side with, a second group of CFET devices. Accordingly, contacts 226, 228, 230, and 232 can be connected to input signals, and a contact 234 can be connected to an output signal. A well-known challenge in ToT 3Di is the increased wiring congestion caused by having to connect the same number of input and output signals as well as internal signal in a substantially reduced footprint area.

Techniques herein provide a construct (i.e. a layout structure with a specific function) and associated integration solution to facilitate critical connections in stacked CFET 3Di while minimizing the impact on sparse wiring resources. More specifically, upwards of 40% of a logic block's area is occupied by sequential cells, i.e. not combinatorial cells that execute Boolean logic, but cells that store the intermediate states of logic paths in-between clock cycles. Therefore, the area scaling of logic designs is dominated by the efficiency with which sequential logic cells, such as flip-flops and latches, can be scaled. Techniques herein provide a construct to efficiently scale these types of data storage elements.

A critical component of many logic cells is a pair of cross-coupled transistors, commonly referred to as cross-couple (XC) for short. A multiplexer (MUX) circuit is used as an example of a cell with a XC to illustrate embodiments herein. Wiring XC efficiently and reliably has long been a major priority and a significant challenge for design-technology co-optimization (DTCO). Several patents exist on 2D implementations of XC. This disclosure describes embodiments with a highly efficient means of stacking and connecting pairs of XC in a stacked CFET technology.

Figure 3:
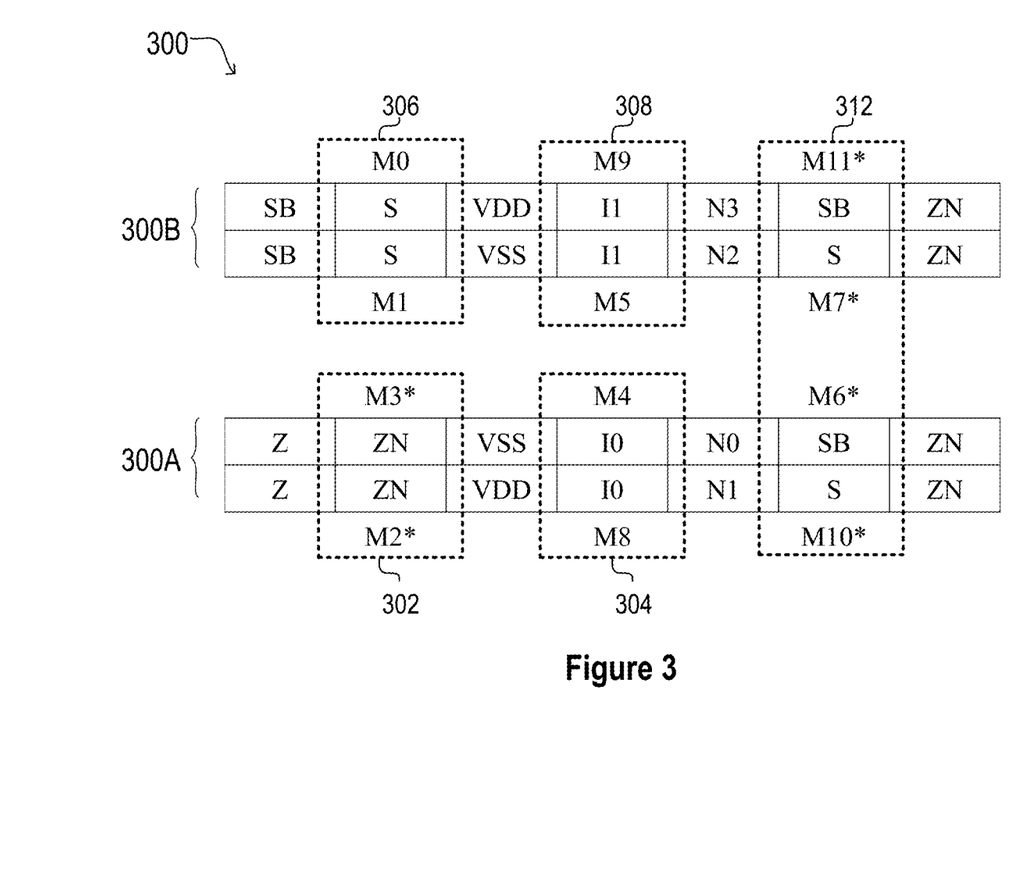
FIG. 3 shows a diagram of a transistor placement in which complementary transistors of a cross-couple (XC) are stacked vertically on top of each other, in accordance with some embodiments of the present disclosure.

FIG. 3 shows a diagram 300 of a transistor placement in which complementary transistors of a cross-couple (XC) are stacked vertically on top of each other, in accordance with some embodiments of the present disclosure. As shown, a MUX circuit can be a complex circuit design. In a non-limiting example, twelve transistors M0, M1, M2*, M3*, M4, M5, M6*, M7*, M8, M9, M10* and M11* can form four complementary pairs (or four CFET devices) 302, 304, 306 and 308 using common-gate connections and a XC 312 with four transistors M11*, M7*, M6* and M10*. In a preferred transistor placement for stacked CFET implementation, specifically for a MUX area of interest, critical inter-level connections can be placed in close proximity. More specifically, complementary transistors of the XC 312 can be stacked vertically on top of each other. That is, the four transistors M11*, M7*, M6* and M10* of the XC 312 are stacked vertically on top of each other and constitute a top CFET stack (including M11* and M7*) and a bottom CFET stack (including M6* and M10*). In some examples, a preferred vertical order of transistor tones is p-n-n-p (or p-type transistor/n-type transistor/n-type transistor/p-type transistor). Reversing the order of the top CFET stack facilitates direct inter-level connectivity for some circuits (such as the stacked pair of XC, described in U.S. Ser. No. 63/121,597 filed on Dec. 4, 2020 and herein incorporated by reference in its entirety) but complicates connectivity for XC that are split across two tiers, requiring the unique construct described herein.

In some embodiments, the diagram 300 can include a first device tier 300A arranged over a substrate (not shown) and a second device tier 300B arranged over the first device tier 300A. The first device tier 300A includes complementary pairs (or CFET devices) 302 and 304 while the second device tier 300B includes complementary pairs (or CFET devices) 306 and 308. For example, the complementary pair 306 can include a p-type transistor M0 stacked over an n-type transistor M1. A gate of the p-type transistor M0 and a gate of the n-type transistor M1 are connected to each other and further connect to a node, S. A first source/drain (S/D) of the p-type transistor M0 is connected to a node, SB, and a second S/D of the p-type transistor M0 is connected to a node, VDD. A first source/drain (S/D) of the n-type transistor M1 is connected to the node, SB, and a second S/D of the n-type transistor M1 is connected to a node, VSS.

Still referring to FIG. 3, the XC 312 includes a first CFET device in the first device tier 300A and a second CFET device in the second device tier 300B. In a non-limiting example, the first CFET device includes a first n-type transistor M6* stacked over a first p-type transistor M10* while the second CFET device includes a second p-type transistor M11* stacked over a second n-type transistor M7*. The first n-type transistor M6* is cross-coupled to the second p-type transistor M11* in that both gates of the first n-type transistor M6* and the second p-type transistor M11* are connected to a same node, SB. The first p-type transistor M10* is cross-coupled to the second n-type transistor M7* in that both gates of the first p-type transistor M10* and the second n-type transistor M7* are connected to a same node, S.

Figure 4:
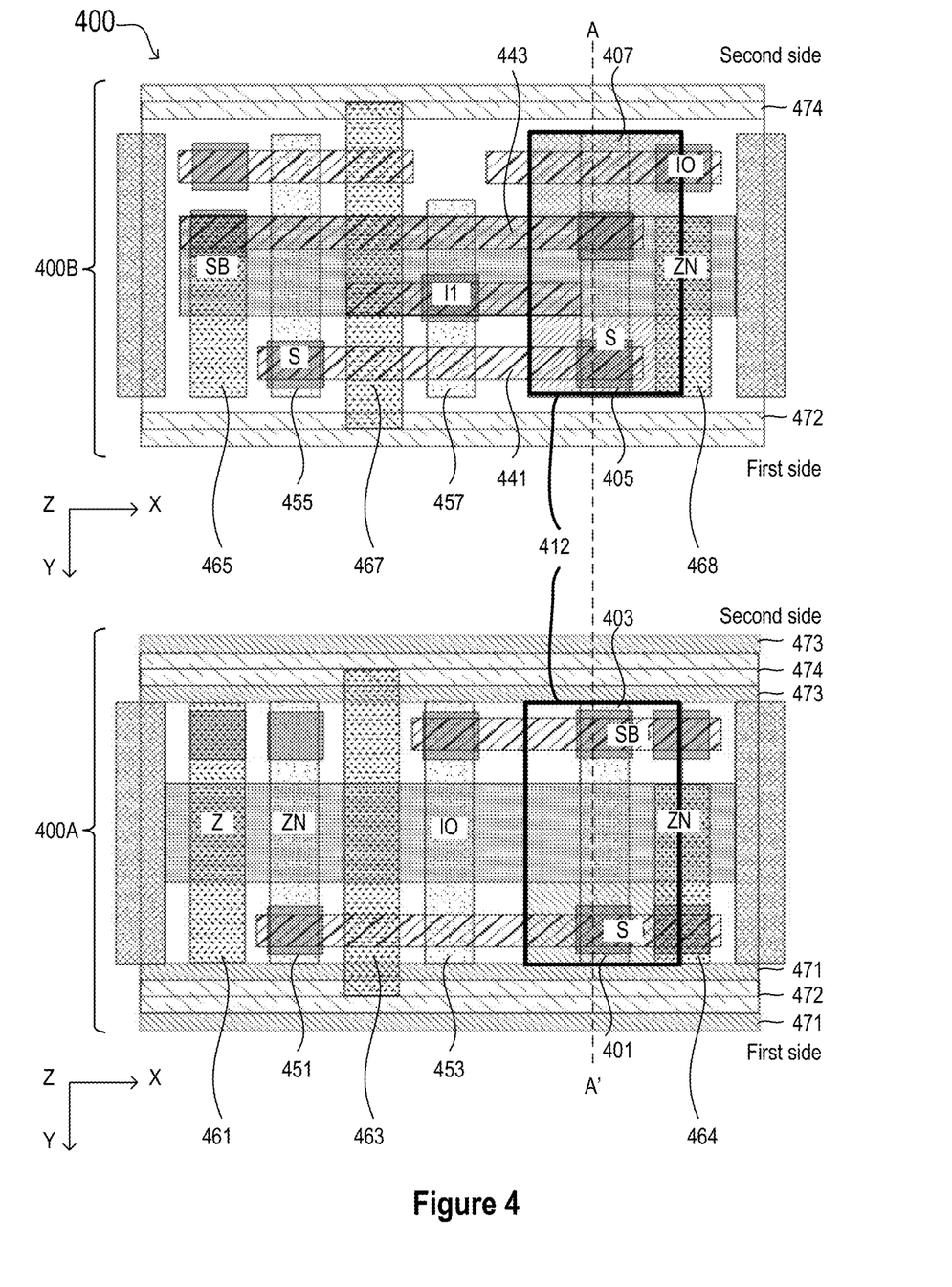
FIG. 4 shows a layout design for the transistor placement in FIG. 3, in accordance with some embodiments of the present disclosure.
Figure 5:
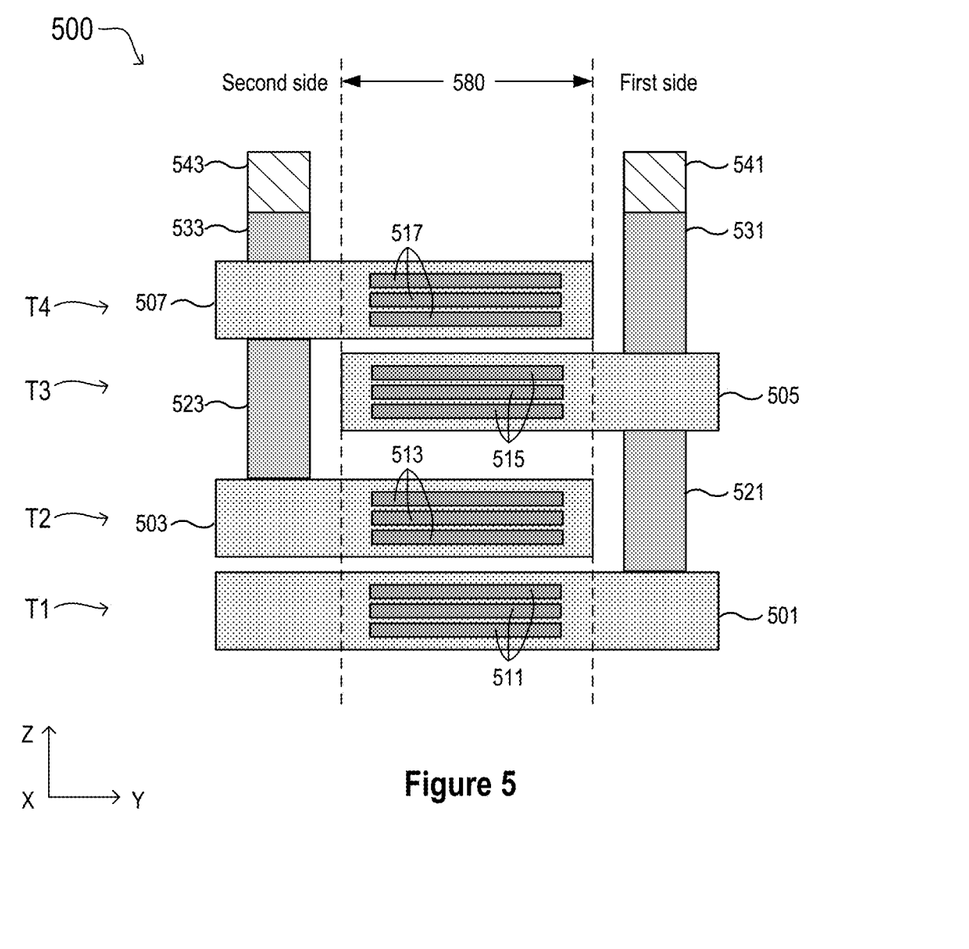
FIG. 5 shows a vertical cross-sectional view of a semiconductor device, in accordance with exemplary embodiments of the present disclosure.

FIG. 4 shows a layout design 400 for the transistor placement in FIG. 3, in accordance with some embodiments of the present disclosure. As the density of specific lines indicates, and as mentioned above, wiring congestion is a major challenge for dense ToT 3Di. To prevent the wiring congestion from impacting area scaling, it is vital to connect highly used circuit elements, such as the XC 312 in FIG. 3, with minimal use of wiring tracks. An example embodiment is illustrated in FIG. 5.

In some embodiments, FIG. 4 can include a MUX for stacked CFET implementation. For clarity, a first device tier 400A and a second device tier 400B are shown as separate layouts. The first device tier 400A and the second device tier 400B correspond to the first device tier 300A and the second device tier 300B respectively. Areas of interest 412, which correspond to the XC 312, are shown by two black boxes.

Specifically, the second device tier 400B can include gate structures 455 and 457, which correspond to gate structures of the CFET devices 306 and 308 respectively. The gate structures 455 and 457 are electrically connected to nodes S and I1 respectively. The second device tier 400B can also include gate structures 405 and 407, which correspond to gate structures of the second CFET device of the XC 312. The gate structures 405 and 407 are electrically connected to nodes S and SB respectively. Further, the second device tier 400B can include S/D local interconnect (LI) structures 465, 467 and 468. Each of the S/D LI structures 465, 467 and 468 can be electrically connected to at least one respective S/D region and a respective node. For example, the S/D LI structure 465 can be electrically connected to at least one S/D region of the CFET device 306 and the node, SB. The S/D LI structure 468 can be electrically connected to at least one S/D region of the XC 312 and a node, ZN.

Similarly, the first device tier 400A can include gate structures 451 and 453 that correspond to gate structures of the CFET devices 302 and 304 respectively. The gate structures 451 and 453 are electrically connected to nodes ZN and I0 respectively. The first device tier 400A can also include gate structures 401 and 403 which correspond to gate structures of the first CFET device of the XC 312. The gate structures 401 and 403 are electrically connected to nodes S and SB respectively. Further, the first device tier 400A can include S/D LI structures 461, 463 and 464. Each of the S/D LI structures 461, 463 and 464 can be electrically connected to at least one respective S/D region and a respective node. For example, the S/D LI structure 461 can be electrically connected to at least one S/D region of the CFET device 302 and a node, Z. The S/D LI structure 464 can be electrically connected to at least one S/D region of the XC 312 and the node, ZN.

Note that in the example of FIG. 4, the gate structures 401 and 405 are both connected to the node S. The gate structures 403 and 407 are both connected to the node SB. Further details of the areas of interest 412 will be explained in FIG. 5.

In some embodiments, the layout design 400 can further include one or more first power rails 471 extending along a first side and one or more second power rails 473 extending along a second side. The layout design 400 can also include a first power wall (or a first conductive plane) 472 positioned over the one or more first power rails 471 and a second power wall (or a second conductive plane) 474 positioned over the one or more second power rails 473. Such power rails and power walls can be configured to provide operation voltages to the transistors.

FIG. 5 shows a vertical cross-sectional view of a semiconductor device 500, in accordance with exemplary embodiments of the present disclosure. In some embodiments, FIG. 5 corresponds to a vertical cross-sectional view taken along the line cut AA' in FIG. 4. The semiconductor device 500 includes several elements. One element is a vertical stack of four split-gate transistors including a top transistor pair and a bottom transistor pair. Embodiments include a series of gate cuts to make space for a series of inter-level contacts. In some embodiments, a first inter-level contact bypasses a top transistor of the bottom transistor pair from a first side of the vertical stack. A second inter-level contact bypasses a bottom transistor of the top transistor pair from a second side of the vertical stack opposite the first side. A third inter-level contact bypasses a top transistor of the top transistor pair from the first side of the vertical stack. The series of inter-level contacts will be explained in detail later.

A pair of inter-level super-contacts (or inter-level contacts) can also be included. A first inter-level super-contact is configured to strap (or electrically connect) the bottom transistor of the top transistor pair to the bottom transistor of the bottom transistor pair, bypassing the top transistor of the bottom transistor pair. A second inter-level super-contact is configured to strap the top transistor of the top transistor pair to the top transistor of the bottom transistor pair, bypassing the bottom transistor of the top transistor pair. As can be appreciated, circuit design elements herein can be used for other designs in addition to the cross-couple.

As shown in FIG. 5, the semiconductor device 500 can include a first pair of transistors positioned over a substrate (not shown). The first pair of transistors includes a first transistor (or a first bottom transistor) T1 having a first gate structure 501 positioned over the substrate and a second transistor (or a first top transistor) T2 having a second gate structure 503 stacked over the first transistor T1. The semiconductor device 500 can also include a second pair of transistors stacked over the first pair of transistors. The second pair of transistors includes a third transistor (or a second bottom transistor) T3 having a third gate structure 505 stacked over the second transistor T2 and a fourth transistor (or a second top transistor) T4 having a fourth gate structure 507 stacked over the third transistor T3. In some embodiments, the first transistor T1, the second transistor T2, the third transistor T3 and the fourth transistor T4 correspond to the transistors M11*, M7*, M6* and M10* respectively.

Further, the first transistor T1, the second transistor T2, the third transistor T3 and the fourth transistor T4 can form a vertical stack perpendicular to a working surface of the substrate. For example, the first gate structure 501, the second gate structure 503, the third gate structure 505 and the fourth gate structure 507 can be spaced apart from one another and stacked in a vertical direction (e.g. the Z direction). The vertical stack can have an interdigitated configuration including the aforementioned series of gate cuts. In a non-limiting example, the third gate structure 505 extends from a central region 580 of the vertical stack to a first side of the vertical stack. The second gate structure 503 and the fourth gate structure 507 both extend from the central region 580 to a second side of the vertical stack opposite the first side. The first gate structure 501 extends from the central region 580 to the first side and the second side. In an alternative embodiment (not shown), the first gate structure 501 may extend from the central region only to the first side.

In some embodiments, the semiconductor device 500 further includes a first inter-level contact 521 positioned on the first side of the vertical stack and configured to electrically connect the first gate structure 501 to the third gate structure 505. For example, the first inter-level contact 521 can be positioned between the first gate structure 501 and the third gate structure 505. The first inter-level contact 521 can bypass the second gate structure 503 from the first side of the vertical stack. The first inter-level contact 521 can correspond to the first gate cut. Similarly, a second inter-level contact 523 can be positioned on the second side of the vertical stack and configured to electrically connect the second gate structure 503 to the fourth gate structure 507. For example, the second inter-level contact 523 can be positioned between the second gate structure 503 and the fourth gate structure 507. The second inter-level contact 523 can bypass the third gate structure 505 from the second side of the vertical stack. The second inter-level contact 523 can correspond to the second gate cut.

In some embodiments, the semiconductor device 500 further includes a first contact structure 531 positioned on the first side of the vertical stack and configured to electrically connect the third gate structure 505 to a first wiring structure 541. The first contact structure 531 is positioned over the third gate structure 505 and bypasses the fourth gate structure 507 from the first side of the vertical stack. The first contact structure 531 can correspond to the third gate cut. In some embodiments, a second contact structure 533 can be positioned over the fourth gate structure 507 and configured to electrically connect the fourth gate structure 507 to a second wiring structure 543. The second contact structure 533 can be positioned on the first side of the vertical stack as shown in this example or in the central region 580 in another example (not shown). In some embodiments, power rails (not shown) that correspond to the first and second power trails 471 and 473 in FIG. 4 can be positioned along the first side and the second side of the vertical stack and configured to be electrically connected to the first wiring structure 541 and the second wiring structure 543.

In some embodiments, the semiconductor device 500 further includes a first channel structure 511 surrounded by the first gate structure 501, a second channel structure 513 surrounded by the second gate structure 503, a third channel structure 515 surrounded by the third gate structure 505 and a fourth channel structure 517 surrounded by the fourth gate structure 507. The first channel structure 511, the second channel structure 513, the third channel structure 515 and the fourth channel structure 517 can be positioned in the central region 580 and extend in a horizontal direction (e.g. the X direction) parallel to the working surface of the substrate. For example, the first channel structure 511, the second channel structure 513, the third channel structure 515 and the fourth channel structure 517 can each include one or more respective nanosheets that extend in the horizontal direction, are spaced apart from one another and are stacked above one another.

In some embodiments, the first pair of transistors includes a first CFET, and the second pair of transistors includes a second CFET. In a non-limiting example, the first transistor T1 is a p-type FET; the second transistor T2 is an n-type FET; the third transistor T3 is an n-type FET; and the fourth transistor T4 is a p-type FET.

While not shown, techniques herein can be used for a semiconductor device including more than two pairs of transistors stacked over a substrate. Each pair of transistors includes a respective top transistor (e.g. T4) having a respective top gate (e.g. 507) stacked over a respective bottom transistor (e.g. T3) having a respective bottom gate (e.g. 505). The more than two pairs of transistors can form a vertical stack perpendicular to a working surface of the substrate. A plurality of bottom gate structures (e.g. 505) can extend from a central region of the vertical stack to a first side of the vertical stack. A plurality of top gate structures (e.g. 507) can extend from the central region to a second side of the vertical stack opposite the first side.

In some embodiments, first inter-level contacts (e.g. 521) can be positioned on the first side of the vertical stack and each configured to electrically connect two respective bottom gate structures. At least one first inter-level contact bypasses a respective top gate structure from the first side of the vertical stack. Similarly, second inter-level contacts (e.g. 523) can be positioned on the second side of the vertical stack and each configured to electrically connect two respective top gate structures. At least one second inter-level contact bypasses a respective bottom gate structure from the second side of the vertical stack.

In some embodiments, a first contact structure (e.g. 531) can be positioned on the first side of the vertical stack and positioned over a respective bottom gate structure (e.g. 505) of a topmost pair of transistors and bypasses a respective top gate structure (e.g. 507) of the topmost pair of transistors from the first side of the vertical stack. A second contact structure (e.g. 533) can be positioned over the respective top gate structure (e.g. 507) of the topmost pair of transistors.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
    a first pair of transistors positioned over a substrate, the first pair of transistors including a first transistor that has a first gate structure and is positioned over the substrate and a second transistor that has a second gate structure and is stacked over the first transistor; and
    a second pair of transistors stacked over the first pair of transistors, resulting in a vertical stack perpendicular to a working surface of the substrate, the second pair of transistors including a third transistor that has a third gate structure and is stacked over the second transistor and a fourth transistor that has a fourth gate structure and is stacked over the third transistor, wherein
    the third gate structure extends from a central region of the vertical stack to a first side of the vertical stack,
    the second gate structure and the fourth gate structure both extend from the central region of the vertical stack to a second side of the vertical stack opposite the first side of the vertical stack, and
    the first gate structure, the second gate structure, the third gate structure and the fourth gate structure are spaced apart from one another.

2. The semiconductor device of claim 1, further comprising:
    a first inter-level contact positioned on the first side of the vertical stack and configured to electrically connect the first gate structure to the third gate structure; and
    a second inter-level contact positioned on the second side of the vertical stack and configured to electrically connect the second gate structure to the fourth gate structure.

3. The semiconductor device of claim 2, wherein:
    the first inter-level contact is positioned between the first gate structure and the third gate structure, and
    the first inter-level contact bypasses the second gate structure from the first side of the vertical stack.

4. The semiconductor device of claim 2, wherein:
    the second inter-level contact is positioned between the second gate structure and the fourth gate structure, and
    the second inter-level contact bypasses the third gate structure from the second side of the vertical stack.

5. The semiconductor device of claim 1, further comprising:
    a first channel structure surrounded by the first gate structure;
    a second channel structure surrounded by the second gate structure;
    a third channel structure surrounded by the third gate structure; and
    a fourth channel structure surrounded by the fourth gate structure.

6. The semiconductor device of claim 5, wherein:
    the first channel structure, the second channel structure, the third channel structure and the fourth channel structure extend in a horizontal direction parallel to the working surface of the substrate.

7. The semiconductor device of claim 6, wherein:
    the first channel structure, the second channel structure, the third channel structure and the fourth channel structure each include one or more respective nanosheets that extend in the horizontal direction and are spaced apart from one another.

8. The semiconductor device of claim 5, wherein:
    the first channel structure, the second channel structure, the third channel structure and the fourth channel structure are positioned in the central region of the vertical stack.

9. The semiconductor device of claim 1, further comprising:
    a first contact structure positioned on the first side of the vertical stack and configured to electrically connect the third gate structure to a first wiring structure.

10. The semiconductor device of claim 9, further comprising:
    a second contact structure positioned over the fourth gate structure and configured to electrically connect the fourth gate structure to a second wiring structure.

11. The semiconductor device of claim 10, further comprising:
    power rails positioned along the first side and the second side of the vertical stack and configured to be electrically connected to the first wiring structure and the second wiring structure.

12. The semiconductor device of claim 9, wherein:
    the first contact structure is positioned over the third gate structure and bypasses the fourth gate structure from the first side of the vertical stack.

13. The semiconductor device of claim 1, wherein:
    the first gate structure extends from the central region of the vertical stack to the first side of the vertical stack, or the first gate structure extends from the central region of the vertical stack to the first side and the second side of the vertical stack.

14. The semiconductor device of claim 1, wherein:
    the first pair of transistors includes a first complementary field-effect transistor (CFET), and
    the second pair of transistors includes a second CFET.

15. The semiconductor device of claim 14, wherein:
the first transistor is a p-type field-effect transistor (FET),
the second transistor is an n-type FET,
the third transistor is an n-type FET, and
the fourth transistor is a p-type FET.

16. A semiconductor device, comprising:
pairs of transistors stacked over a substrate, resulting in a vertical stack perpendicular to a working surface of the substrate, each pair of transistors including a respective top transistor that has a respective top gate and is stacked over a respective bottom transistor having a respective bottom gate, wherein
a plurality of bottom gate structures extends from a central region of the vertical stack to a first side of the vertical stack,
a plurality of top gate structures extends from the central region of the vertical stack to a second side of the vertical stack opposite the first side of the vertical stack,
a first contact structure positioned on the first side of the vertical stack and positioned over a respective bottom gate structure of a topmost pair of transistors and bypasses a respective top gate structure of the topmost pair of transistors from the first side of the vertical stack; and
a second contact structure positioned over the respective top gate structure of the topmost pair of transistors.

17. The semiconductor device of claim 16, further comprising:
first inter-level contacts positioned on the first side of the vertical stack and each configured to electrically connect two respective bottom gate structures; and
second inter-level contacts positioned on the second side of the vertical stack and each configured to electrically connect two respective top gate structures.

18. The semiconductor device of claim 17, wherein:
at least one first inter-level contact bypasses a respective top gate structure from the first side of the vertical stack, and
at least one second inter-level contact bypasses a respective bottom gate structure from the second side of the vertical stack.

19. A semiconductor device, comprising:
a first pair of transistors positioned over a substrate, the first pair of transistors including a first transistor that has a first gate structure and is positioned over the substrate and a second transistor that has a second gate structure and is stacked over the first transistor;
a second pair of transistors stacked over the first pair of transistors, resulting in a vertical stack perpendicular to a working surface of the substrate, the second pair of transistors including a third transistor that has a third gate structure and is stacked over the second transistor and a fourth transistor that has a fourth gate structure and is stacked over the third transistor;
a first inter-level contact positioned on the first side of the vertical stack and configured to electrically connect the first gate structure to the third gate structure; and
a second inter-level contact positioned on the second side of the vertical stack and configured to electrically connect the second gate structure to the fourth gate structure, wherein
the third gate structure extends from a central region of the vertical stack to a first side of the vertical stack,
the second gate structure and the fourth gate structure both extend from the central region of the vertical stack to a second side of the vertical stack opposite the first side of the vertical stack,
the first inter-level contact is positioned between the first gate structure and the third gate structure, and
the first inter-level contact bypasses the second gate structure from the first side of the vertical stack.

20. The semiconductor device of claim 19, wherein:
the second inter-level contact is positioned between the second gate structure and the fourth gate structure, and
the second inter-level contact bypasses the third gate structure from the second side of the vertical stack.

* * * * *